United States Patent
Ueda et al.

[11] Patent Number: 6,060,826
[45] Date of Patent: May 9, 2000

[54] ORGANIC ELECTROLUMINESCENT ELEMENT HAVING AN EXCIMER LIGHT IRRADIATED POSITIVE ELECTRODE AND METHOD OF MANUFACTURING THE SAME

[75] Inventors: Hideaki Ueda, Kishiwada; Keiichi Furukawa; Yoshihisa Terasaka, both of Suita, all of Japan

[73] Assignee: Minolta Co., Ltd., Osaka, Japan

[21] Appl. No.: 09/034,954

[22] Filed: Mar. 4, 1998

[30] Foreign Application Priority Data

Mar. 19, 1997 [JP] Japan ................................ 9-065999

[51] Int. Cl.[7] ............................. H01J 63/04; H01J 1/62
[52] U.S. Cl. .................... 313/498; 313/504; 313/506; 445/24; 445/46; 445/50; 445/59
[58] Field of Search .................... 313/498, 503, 313/504, 506, 507; 445/24, 46, 49, 50, 59, 52; 372/57

[56] References Cited

U.S. PATENT DOCUMENTS

| | | | |
|---|---|---|---|
| 3,530,325 | 9/1970 | Mehl et al. | 313/108 |
| 4,539,507 | 9/1985 | VanSlyke et al. | 313/504 |
| 4,730,432 | 1/1988 | VanSlyke et al. | 313/498 |
| 5,432,015 | 7/1995 | Wu et al. | 428/690 |

FOREIGN PATENT DOCUMENTS 7-142168  6/1995  Japan .

OTHER PUBLICATIONS

Eliasson, Baldur and Kogelschatz, Ulrich. "Modeling and Applications of Silent Discharge Plasmas." IEEE Transcations on Plasma Science, vol. 10, No. 2, Apr. 1991, pp. 309–323, Apr. 1991.

Institute of Electronics, Information and Communications Engineers (IEICE), Spring Conference Proceedings, 1993, pp: 5:347–5–348, The electrical and luminescent properties in organic LED: the effects of the preparation conduction, including English translation.

*Primary Examiner*—Vip Patel
*Assistant Examiner*—Michael J. Smith
*Attorney, Agent, or Firm*—Morrison & Foerster LLP

[57] ABSTRACT

The purpose of the present invention is to provide an organic electroluminescent element having uniform surface luminescence, large luminescence intensity, and excellent stability over repeated use. The present invention provides a method of manufacturing an organic electroluminescent element using a positive electrode irradiated by excimer light when manufacturing an organic electroluminescent element comprising at least a substrate on which is sequentially formed a positive electrode, organic layer including an organic luminescent layer, and negative electrode, and an organic electroluminescent element manufactured by said method.

12 Claims, 4 Drawing Sheets

ORGANIC ELECTROLUMINESCENT ELEMENT HAVING AN EXCIMER LIGHT IRRADIATED POSITIVE ELECTRODE AND METHOD OF MANUFACTURING THE SAME

This application is based on Japanese application No. 09-65999, the content of which is incorporated herein by reference.

BACKGROUND OF THE INVENTION

1. Field of the Invention

The present invention relates to an organic electroluminescent element and method of manufacturing the same.

2. Description of the Related Art

Electroluminescent elements comprise at least a light-emitting material. Organic electroluminescent elements are elements constructed using organic compounds which emit light in response to electric signals.

Organic electroluminescent elements basically comprise an organic luminescent layer interposed between a pair of opposed electrodes. Luminescence is a phenomenon which occurs when a luminescent body within the luminescent layer is excited to a higher energy level and the excited luminescent body returns to its original base state and discharges said surplus energy as light. This is achieved by the injection of electrons from one electrode and the injection of holes from the other electrode.

In order to improve luminescence efficiency, the aforesaid basic construction supplemented by a hole injection layer added to the electrode that injects holes, and an electron transport layer may be added to the electrode that injects electrons.

An example of an electroluminescent element is disclosed in U.S. Pat. No. 3,530,325 which uses single crystals of anthracene in the luminescent element.

U.S. Pat. No. 4,539,507 discloses a combination of a hole injection layer and an organic luminescent layer.

U.S. Pat. No. 4,720,432 discloses a combination of a hole injection/transporting layer and an electron injection/transporting layer.

Organic electroluminescent elements having the aforesaid laminate layer constructions are constructed by superimposing, one over another, an organic fluorescent body, charge-transporting organic material (charge-transporting member), and electrodes, such that luminescence is generated when holes and electrons injected by the respective electrodes move within the charge-transporting member and recombine. Examples of material which are useful as organic fluorescent bodies include organic pigments which generate fluorescence such as 8-quinolinol-aluminum complex, coumarin compounds and the like. Examples of useful charge-transporting materials include N'-di(m-tolyl)N,N'-diphenylbenzidene, 1,1-bis[N,N-di(p-tolyl)aminophenyl]cyclohexane and like diamino compounds, 4-(N,N-diphenyl)aminobenzaldehyde-N,N-diphenylhydrazone compounds and the like. The use of porphyrin compounds such as copper phthalocyanine have also been proposed.

It has been reported that deterioration of luminescence characteristics over time can be suppressed, and the luminescence threshold electric potential can be reduced, by treating a positive electrode of Indium Tin Oxide ("ITO") film with a secondary process of plasma surface processing. This is one example of an enhancing agent which improves the practicality of organic electroluminescent elements (e.g., Institute of Electronics, Information, and Communications Engineers (IEICE), Spring Conference Proceedings, 5-347, 1993).

The term "plasma" as used herein means a completely ionized gas, composed entirely of a nearly equal number of positive and negative free charges (positive ions and electrons). The meaning of the term plasma as used herein is consistent with its definition in the McGraw Hill Dictionary of Scientific and Technical Terms, 1226 (1982).

The use of a plasma process as a method of washing an ITO film was disclosed in Japanese Laid-Open Patent No. 7-142168 and the like.

These plasma processes provide inadequate washing effectiveness. The plasma processing causes the excited atoms to impinge the electrode directly in a vacuum, and is harmful to the device. When a plasma processed substrate is used in the manufacture of electroluminescent elements non-luminescent areas of black spots occur within the luminescent surface, such that the luminescence starting potential is reduced and stable luminescent characteristics cannot be obtained.

OBJECTS AND SUMMARY

In view of the aforesaid information, an object of the present invention is to provide an electroluminescent element having a low luminescence starting potential while maintaining stable luminescence characteristics, substantially free of non-luminescent areas of black spots within the luminescent surface.

The present invention provides a method of manufacturing an organic electroluminescent element comprising sequential laminations on a substrate of at least a positive electrode and an organic layer, including an organic luminescent layer and a cathode, wherein the positive electrode is irradiated by excimer light. Excimer light as used herein is described in "DETAILED DESCRIPTION OF THE PREFERRED EMBODIMENTS."

The present invention further provides a method of manufacturing an organic electroluminescent element comprising sequential laminations on a substrate of at least a positive electrode, an organic layer including an organic luminescent layer and a cathode, wherein the positive electrode is irradiated by excimer light after the positive electrode is washed by a wet type washing method or the like.

The present invention further provides a method of manufacturing an organic electroluminescent element comprising sequential laminations on a substrate of at least a positive electrode, an organic layer including an organic luminescent layer and a cathode, wherein the positive electrode is irradiated by excimer light without exposing the positive electrode to air.

Another object of this invention is to provide a device having an organic electroluminescent element. A further object of this invention is to provide a method of using an organic electroluminescent element applying 10 V of direct current to produce uniform luminescence without dark spots on said organic electroluminescent element. Other objects of the invention are apparent from the discussion herein.

BRIEF DESCRIPTION OF THE DRAWINGS

The above, and other objects and features of the present invention, will become apparent from the following description of the preferred embodiments thereof taken in conjunction with the accompanying drawings, in which.

In the following description, like parts are designated by the same reference numbers in all of the drawings.

DETAILED DESCRIPTION OF THE PREFERRED EMBODIMENTS

Figure 1:
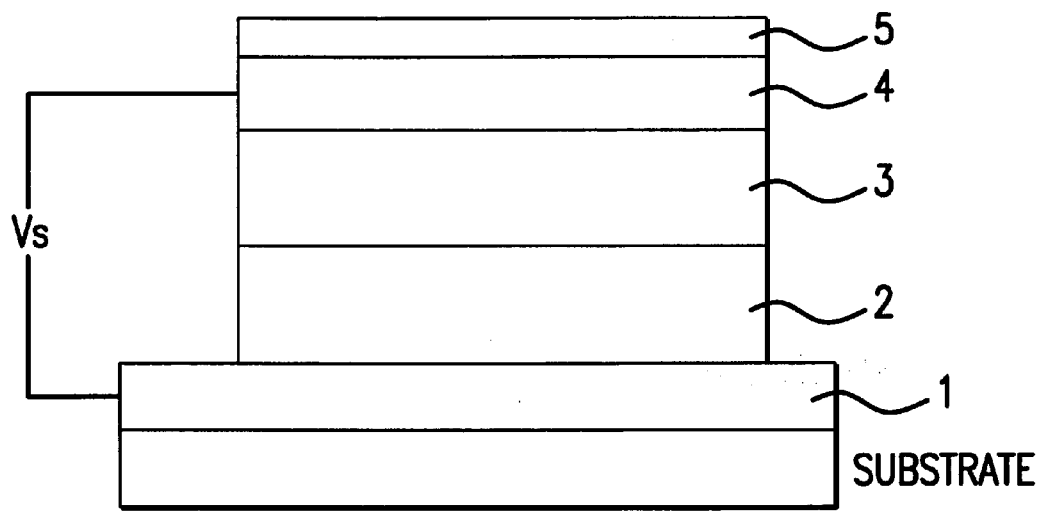
FIG. 1 shows the construction of an example of an organic electroluminescent element of the present invention, comprising a substrate, a positive electrode, a hole injection/ transporting layer, an organic luminescent layer, a negative electrode, and a sealing layer.

The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The embodiments of the organic electroluminescent element of the present invention comprise at least an organic luminescent layer, and optionally an organic hole-transporting layer interposed between a positive electrode and a negative electrode.

A characteristic of the organic electroluminescent element of the present invention is that the positive electrode of the organic electroluminescent element is irradiated by excimer light.

Excimer light is fluorescent light emitted from an excimer. Excimer light is a fluorescent light emitted from an excimer when the atom in an excited state returns to its basic state. An excimer is the product of the association of a single atom in a basic state and a single atom in an excited state that results in a dimer which is stable only in the excited state. A heteroexcimer is the product of two atoms of different types. In the present invention, excimer light irradiates a positive electrode.

In the present invention, excimer light may have a wavelength of less than 310 nm. The present invention specifically pertains to excimers emitting short wavelength ultraviolet light of less than 175 nm, which is very effective in cleansing the positive electrode, which in turn improves the luminescence characteristics of the luminescent element.

Excimer light is produced in an "excimer lamp," by photoexcitation or electronic excitation in a plasma discharge. The gas may be He, Ar, Xe or HeCl, XeCl, KrF, ArCl and the like sealed in a lamp at high pressure. Excimer light differs from plasma in that it is substantially free of ionized gas; instead, it is radiation emitted from ionized gas.

Although a longer exposure time is better, operational problems make an exposure time of one hour or less desirable.

The excimer lamp used in the present invention may be a commercial excimer lamp such as a dielectric barrier excimer lamp or the like, but is not limited to such lamps.

Irradiation of the electrode by excimer light may occur in air or in a vacuum. When a positive electrode is irradiated by excimer light in an atmosphere containing oxygen, ozone and excited oxygen atoms are generated. Short wavelength ultraviolet radiation from photons is particularly effective in volatilizing a microscopically thin layer of the surface of the positive electrode in the presence of excited oxygen atoms, which are actively generated in wavelengths less than 175 nm. The excimer light cleanses the surface of the positive electrode by breaking the chemical bonds of the organic matter adhering to the positive electrode and volatilizing a microscopically thin layer off the surface of said electrode. Therefore, this cleansing of the surface of the electrode allows the formation of a homogeneous organic thin film by strengthening the bonding force between the surface of the positive electrode and the organic thin film deposited thereon. Furthermore, the surface of the positive electrode is oxidized by the excited oxygen atoms that increase the ionization potential and reduces the gap and ionization potential of the hole-transporting layer so as to effectively improve hole injection.

As a result, there is uniform luminance of the layer of electroluminescent material; luminescence starts at a low electric potential due to the ease of hole injection, producing a high degree of brightness. In addition, the service life is prolonged when continuous luminescence occurs at the same level of brightness.

Conventional wet-type washing methods, plasma processing, UV/ozone washing and the like are disadvantageous inasmuch as they cannot completely remove soiling matter from the surface of the positive electrode. Plasma processing and UV/ozone washing are low energy processes that do not generate large quantities of excited oxygen atoms. These processes have several disadvantages: a long processing time, inadequate cleansing and re-adherence of soiling matter and impurities to the surface.

Further disadvantages arise in conventional processes when the positive electrode is partially oxidized and conductivity is reduced, resulting in inadequate luminescence, and increased luminescence starting voltage. The reason for this disadvantage is not apparent, but a conventional process such as a plasma process may change the crystal lattice of the compounds comprising the positive electrode due to the exposure of the positive electrode to high energy.

The present invention eliminates the previously described disadvantages by providing a method of manufacturing an organic electroluminescent element having a low luminescence starting potential and stable luminescence characteristics without non-luminescent areas of black spots within the luminescent surface. Furthermore, this invention improves hole injection characteristics by removing soiling matter and impurities from the surface of a positive electrode in a short time and oxidizing said positive electrode.

Irradiation by excimer light in the present invention is effectively accomplished by combining wet type washing and plasma processing, and other washing methods such as UV/ozone washing. That is, after the positive electrode is washed by these methods, it is desirable to wash it using excimer light, according to the present invention. Therefore, dispersion in the degree of cleaning prior to irradiation can be minimized to achieve uniformity and provide production of stable elements.

Wet-type washing pertains to methods of cleaning the substrate surface by brushing or sponging the positive electrode in an aqueous or organic solvent bath. Plasma washing pertains to methods of cleaning by direct exposure of the positive electrode substrate to ions or excited atoms of oxygen or nitrogen obtained by plasma discharge in a vacuum or under low pressure. UV/ozone washing pertains to methods of cleaning by irradiating the positive electrode with an ultraviolet lamp in an oxygen gas atmosphere, and oxidative destruction of organic matter by ozone generated by said ultraviolet light.

After irradiation by excimer light, it is desirable that an organic layer including a luminescent layer, and negative electrode or sealing layer, are sequentially formed without exposure to air. Performing these procedures in the absence of air prevents deterioration of the element due to the atmospheric moisture and oxygen, and allows for the manufacture of an organic electroluminescent element capable of long service life with minimal non-luminescent areas.

The construction of the organic electroluminescent element is shown in FIGS. 1~4. In FIG. 1, reference number 1 refers to a positive electrode, over which are sequentially superimposed an organic hole injection/transporting layer 2, organic luminescent layer 3, negative electrode 4, and sealing layer 5.

Figure 2:
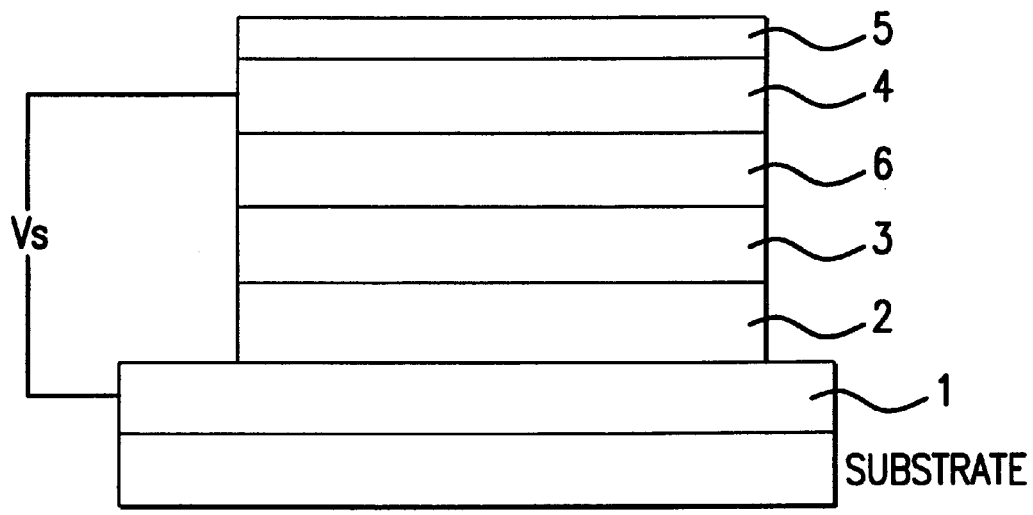
FIG. 2 shows the construction of an example of an organic electroluminescent element of the present invention, comprising a substrate, a positive electrode, a hole injection/ transporting layer, an organic luminescent layer, an electron injection/transporting layer, a negative electrode, and a sealing layer.
Figure 3:
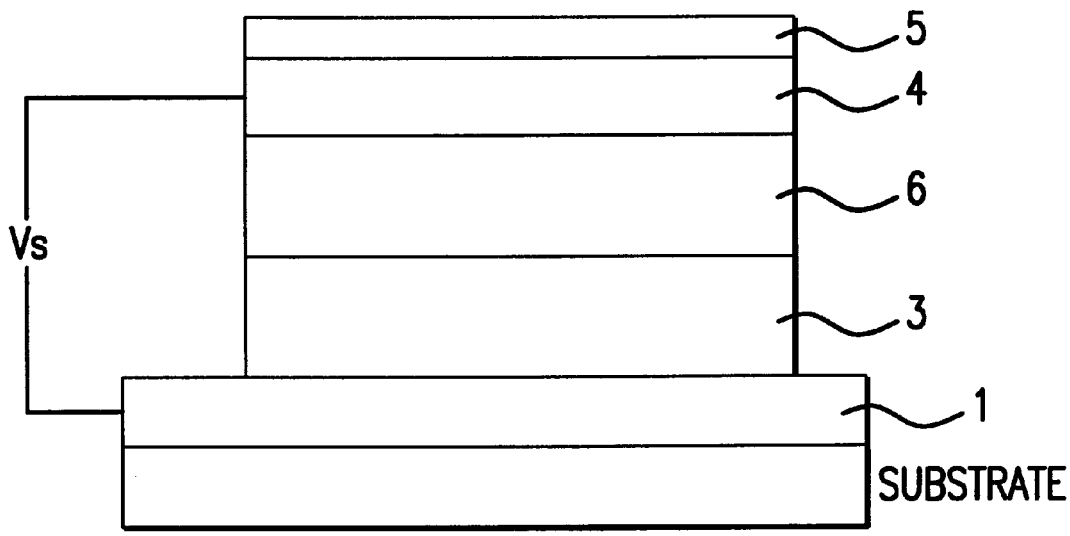
FIG. 3 shows the construction of an example of an organic electroluminescent element of the present invention, comprising a substrate, a positive electrode, an organic luminescent layer, an electron injection/transporting layer, a negative electrode, and a sealing layer.

In FIG. 2, reference number 1 refers to a positive electrode, over which are sequentially superimposed a hole injection/transporting layer 2, organic luminescent layer 3, electron injection/transporting layer 6, negative electrode 4, and sealing layer 5, In FIG. 3, reference number 1 refers to a positive electrode, over which are sequentially superimposed an organic luminescent layer 3, electron injection/transporting layer 6, negative electrode 4, and sealing layer 5.

Figure 4:
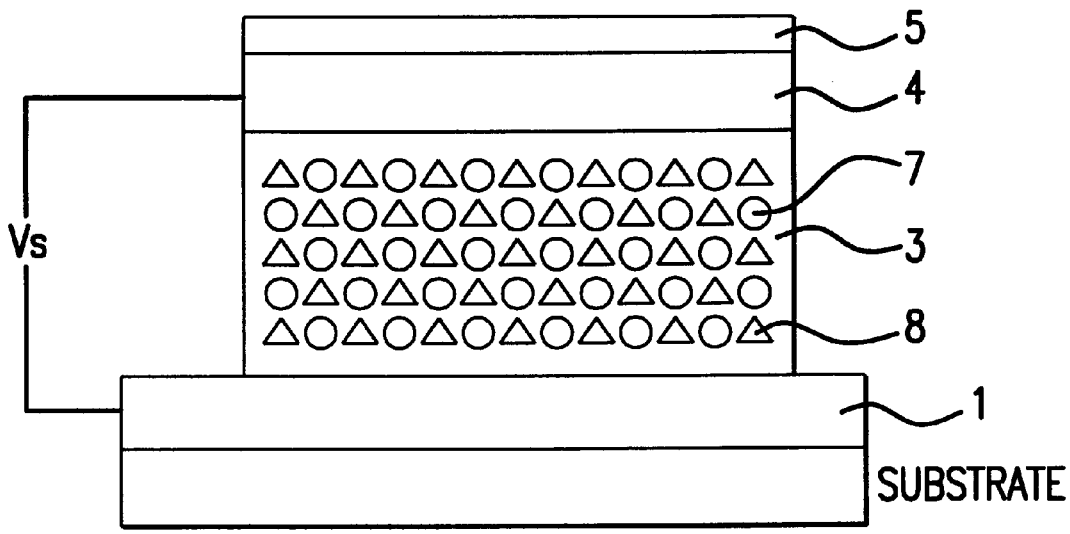
FIG. 4 shows the construction of an example of an organic electroluminescent element of the present invention, comprising a substrate, a positive electrode, an organic luminescent layer, a negative electrode, and a sealing layer.

In FIG. 4, reference number 1 refers to a positive electrode over which are sequentially superimposed an organic luminescent layer 4, negative electrode 4, and sealing layer 5, wherein said organic luminescent layer 4 includes an organic luminescent layer 7 and charge-transporting material 8.

Each of the electroluminescent elements having the above-mentioned constructions has positive electrodes 1 connected to negative electrodes 4 by lead wires, such that the organic luminescent layer 3 luminesces when voltage is applied to said positive electrode 1 and negative electrode 4.

Figure 5:
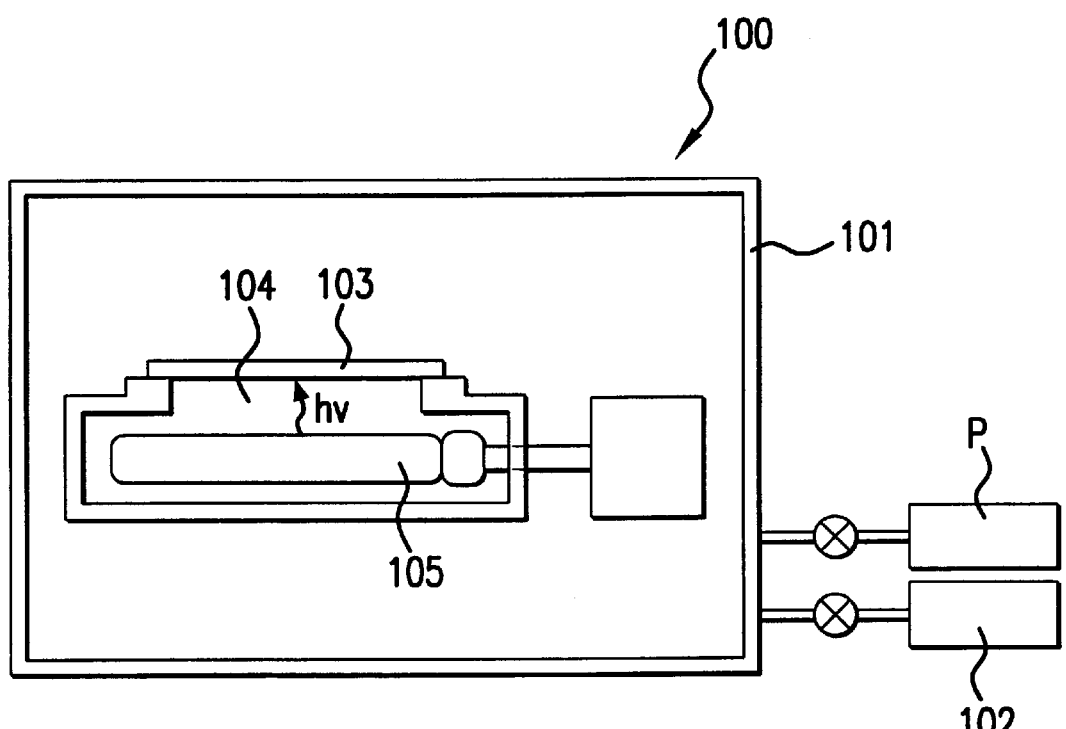
FIG. 5 shows the construction of a device to irradiate, via excimer light, the anode substrate of an organic electroluminescent element of the present invention.

In FIG. 5, reference numbers 101 and 102 refer to the chamber and vacuum pump, respectively, of an excimer radiation device 100. The substrate 103 is irradiated by excimer light transmitted through a window 104 and emitted from an excimer lamp or tube 105. The excimer lamp 105, typically made of transparent silicon dioxide, seals plasma and prevents ions or plasma radicals from directly bombarding the substrate.

Figure 6:
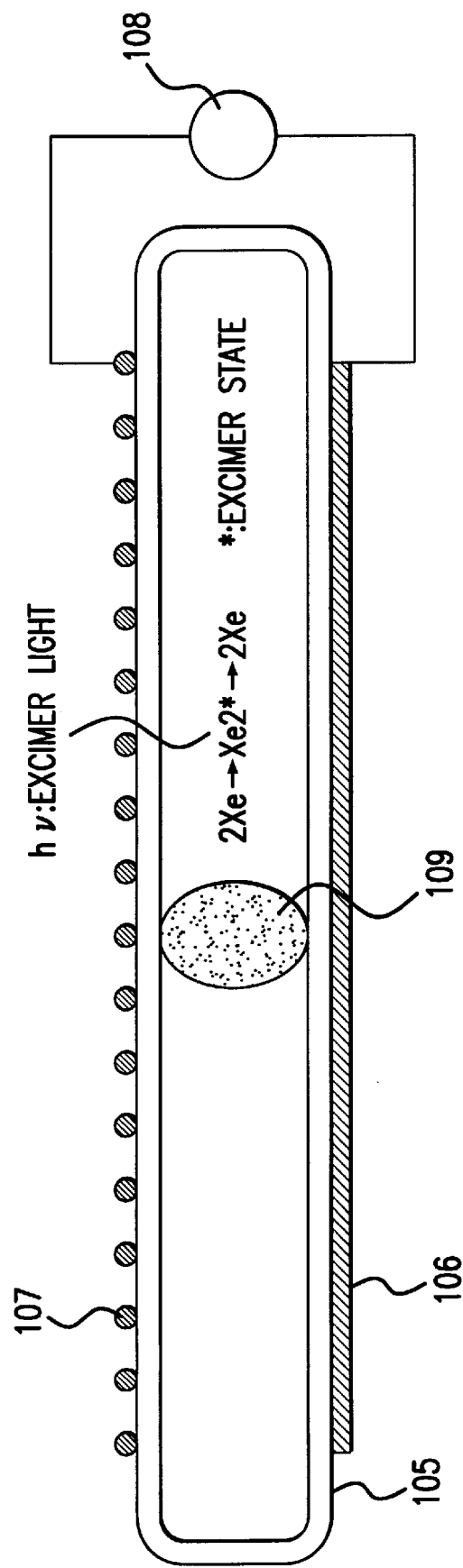
FIG. 6 shows the construction of the excimer lamp or tube used in the device to irradiate the anode substrate of an organic electroluminescent element of the present invention.

In FIG. 6, reference numbers 106 and 107 refer to plate electrode and mesh electrode, respectively, of an excimer lamp or tube 105, which is powered by a power source 108, to create plasma 109 within the excimer tube 105.

The present invention may provide additional organic layers having various functions on the positive and negative electrodes.

It is desirable that the conductive material used for the positive electrode 1 of the organic electroluminescent element has a work function greater than 4 eV. Examples of usable conductive metallic compounds include carbon, aluminum, iron, cobalt, nickel, copper, zinc, tungsten, silver, tin, gold and alloys thereof, such as tin oxide, indium oxide, antimony oxide, zinc oxide, zirconium oxide and the like.

In the organic electroluminescent element it is necessary that at least the positive electrode 1 or the negative electrode 4 is a transparent electrode so that the luminescence is visible. It is desirable that the positive electrode is a transparent electrode inasmuch as transparency is readily lost when a transparent negative electrode is used.

When forming a transparent electrode, the aforesaid conductive material may be applied on a transparent substrate using a means such as vacuum deposition, spattering or the like, or sol-gel method, or means of applying a said material dispersed in resin or the like to assure desired light transmittance and conductivity.

The transparent substrate will have a suitable degree of strength, to withstand the heat during vacuum deposition when manufacturing the organic electroluminescent element. Usable materials are not specifically limited insofar as said materials are transparent; examples of useful materials include glass substrate and transparent resins such as polypropylene, polyether sulfone, polyether-ethylketone and the like. Commercially available products such as ITO, NESA and the like may be used to form a transparent electrode on a glass substrate. NESA is the tradename of a commercial product of Corning Co. Ltd.

After forming a positive electrode as a transparent electrode, it may be patterned in various shapes. Thereafter, it is desirable to wash the surface of the positive electrode and irradiate said cleaned surface via excimer light.

Examples of manufacturing of an electroluminescent element having the construction shown in FIG. 2 is described using the aforesaid electrode. First, a hole injection/transporting layer 2 is provided on the aforesaid electrode 1. Examples of well known hole injection/transporting materials which are usable as the hole injection/transporting layer include N'-diphenyl-N,N'-bis(3-methylphenyl)-1,1'-diphenyl-4,4'-diamine, N,N'-diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenyl-N,N'-bis(2-naphthyl)-1,1'-diphenyl-4,4'-diamine, N,N'-tetra(4-methylphenyl)-1,1'-diphenyl-4,4'-diamine, N,N'-tetra(4-methylphenyl)-1,1'-bis(3-methylphenyl)-4,4'-diamine, N,N'-diphenyl-N,N'-bis(3-methylphenyl)-1,1'-bis(3-methylphenyl)-4,4'-diamine, N,N'-bis(N-carbazolyl)-1,1'-diphenyl-4,4'-diamine, 4,4'4"-tris(N-carbazolyl)triphenylamine, N,N',N"-triphenyl-N,N',N"-tris(3-ethylphenyl)-1,3,5-tri(4-aminophenyl)benzene, 4,4'4"-tris[N,N',N"-triphenyl-N,N',N"-tris(3-methylphenyl)]triphenylamine and the like. The aforesaid materials may be used in combinations of two or more.

When the hole transporting layer 2 is formed by vacuum deposition, its thickness is normally 30~100 nm, whereas when said layer is formed by an application method its thickness is normally 50~200 nm.

An organic luminescent layer 3 is formed on the aforesaid hole transporting layer 2. Examples of well known organic luminescent materials which are usable as the organic luminescent layer include epidridine, 2,5-bis[5,7-di-t-pentyl-2-benzooxazolyl]thiophene, 2,2'-(1,4-phenylenedivinylene)bisbenzothiazole, 2,2'-(4,4'-biphenylene)bisbenzothiazole, 5-methyl-2-{2-[4-(5-methyl-2-benzooxazolyl)phenyl]

vinyl}benzooxazole, 2,5-bis(5-methyl-2-benzooxazolyl) thiophene, anthracene, naphthalene, phenanthrene, pyrene, chrysene, perylene, perynone, 1,4-dipehnylbutadiene, tetraphenylbutadiene, coumarin, acridine, stilbene, 2-(4-biphenyl)-6-phenylbenzooxazole, aluminum trisoxine, magnesium bisoxine, bis(benzo-8-quinolinol)zinc, bis(2-methyl-8-quinolinol)aluminum oxide, indium trisoxine, aluminum tris(5-methyloxine), lithium oxine, gallium trisoxine, calcium bis(5-chlorooxine), polyzinc-bis(8-hydroxy-5-quinolinolyl) methane, dilithium pindridione zinc bisoxine, 1,2-phthaloperinone, 1,2-naphthaloperinone and the like.

Typical fluorescent dyes are also usable, e.g., coumarin dyes, perylene dyes, pyran dyes, thiopyran dyes, polymethine dyes, merocyanine dyes, imidazole dyes and the like. Among these, the most desirable materials are chelated oxynoid compounds.

The organic luminescent layer 3 may have a single layer construction of the aforesaid luminescent materials, or may have a multilayer construction to regulate properties such as the color of luminescence, strength of luminescence and the like. The luminescent layer may be doped by mixing two or more types of luminescent materials.

The organic luminescent layer 3 may be formed by vacuum deposition of the aforesaid luminescent materials, or by dip-coating or spin-coating a liquid comprising said luminescent materials dissolved in a suitable resin or solvent.

When a vacuum deposition method is used to form the organic luminescent layer 3, the thickness of said layer is typically 1~200 nm, whereas the layer thickness is normally 5~500 nm when an application method is used.

A higher application voltage is required to produce luminescence as the layer thickness increases, thereby reducing luminance efficiency, and causing fatigue in the organic electroluminescent element. When the organic electroluminescent layer is formed too thin, luminescence efficiency is excellent but the layer is subject to breakdown, thereby shortening the service life of the organic electroluminescent element.

Examples of well known electron injection/transporting materials which are usable as the electron injection/transporting layer 6 formed on the organic luminescent layer 3 include 2-(4-biphenylyl)-5-(4-tert-butylphenyl)-1,3,4-oxadiazole, 2-(1-naphthyl)-5-(4-tert-butylphenyl)-1,3,4-oxadiazole, 1,4-bis{2-[5-(4-tert-butylphenyl)-1,3,4-oxadiazolyl]}benzene, 1,3-bis{2-[5-(4-tert-butylphenyl)-1,3,4-oxadiazolyl]}benzene, 4,4'-bis{2-[5-(4-tert-butylphenyl)-1,3,4-oxadiazolyl]}biphenyl, 2-(4-biphenylyl)-5-(4-tert-butylphenyl)-1,3,4-thiodiazole, 2-(1-naphthyl)-5-(4-tert-butylphenyl)-1,3,4-thiodiazole, 1,4,-bis{2-[5-(4-tert-butylphenyl)-1,3,4-thiodiazolyl]}benzene, 1,3,-bis{2-[5-(4-tert-butylphenyl)-1,3,4-thiodiazolyl]}benzene, 4,4'-bis{2-[5-(4-tert-butylphenyl)-1,3,4-thiodiazolyl]}biphenyl, 3-(4-biphenylyl)-4-phenyl-5-(4-tert-butylphenyl)-1,2,4-triazole, 3-1-naphthyl)-4-phenyl-5-(4-tert-butylphenyl)-1,2,4-triazole, 1,4, -bis{3-[4-phenyl-5-(4-tert-butylphenyl)-1,2,4-triazolyl]}benzene, 1,3-bis{3-[4-phenyl-5-(4-tert-butylphenyl)-1,3,4-oxadiazolyl]}benzene, 4,4'-bis{2-[4-phenyl-5-(4-tert-butylphenyl)-1,3,4-oxadiazolyl]}biphenyl, 1,3,5-tris{2-[5-(4-tert-butylphenyl)-1,3,4-oxadiazolyl]}benzene and the like. These materials may be used in combinations of two or more.

When the electron injection/transporting layer is formed by vacuum deposition, it may have a thickness of 1~500 nm, and may have a thickness of 5~1,000 nm when formed by an application method.

A negative electrode is then formed on the electron injection/transporting layer 6. The metal used to form the negative electrode 4 include alloys of magnesium, calcium, titanium, yttrium-lithium, gadolinium, ytterbium, ruthenium, manganese and the like, which should preferably have a work function of 4 eV or less.

A single assembly of positive and negative transparent electrodes has each electrode connected via a suitable lead wire 9 of chrome, gold, copper, platinum or the like, such that the organic luminescent device will luminesce when suitable voltages Vs are applied to both electrodes.

In the electroluminescent element having the construction shown in FIG. 2, a sealing layer 5 is formed on the negative electrode 4. The sealing layer 5 seals out moisture and prevents oxidation of the negative electrode and the organic layer. The sealing layer 5 may be formed of $SiO_2$, SiO, GeO, $MgF_2$ and the like, and it is desirable to form said layer via vacuum deposition to a thickness of about 5~1,000 nm.

Although manufacture of the organic electroluminescent element has been described in terms of the construction shown in FIG. 2, other manufacturing examples include organic electroluminescent elements having the constructions shown in FIG. 1, 3, and 4.

The organic electroluminescent element of the present invention is applicable to various types of display devices.

Specific examples of the present invention are described hereinafter.

EXAMPLE 1

The ITO layer of a commercial glass substrate with adhered ITO layer (GEOMATEC CO. Ltd.) was subjected to ultrasonic washing in distilled water and acetone for about 20 minutes The cleaned ITO substrate 103 was placed in chamber 101 of the excimer irradiation device 100 shown in FIG. 5. The pressure within chamber 101 was reduced to a vacuum of less than $1.0 \times 10^{-5}$ Torr via a vacuum pump P. Thereafter, pure air gas (99.99% pure, oxygen:nitrogen ratio 1:4) was introduced from a steel gas cylinder to attain a pressure of 0.2 Torr within the chamber 101, whereupon the substrate 103 was irradiated for 3 min by excimer light of 172 nm wavelength via an excimer lamp 105 through a window 104. The excimer lamp 105 used was a commercial model excimer irradiation device (USHIO DENKI K.K.) provided with an excimer lamp using Xenon gas.

After processing, the ITO substrate 103 was removed from the excimer irradiation device 100. Subsequently, a triphenyl amine conductive layer having the structural formula (A) was formed on the substrate at a vacuum deposition rate of 5 Å/sec and a thickness of 65 nm as a hole injection/transporting layer under a vacuum of $1.0 \times 10^{-5}$ Torr.

Then tris(8-hydroxyquinoline)aluminum complex was deposited on the surface of the substrate at a vacuum deposition rate of 6 Å/sec and thickness of 65 nm as a luminescent layer.

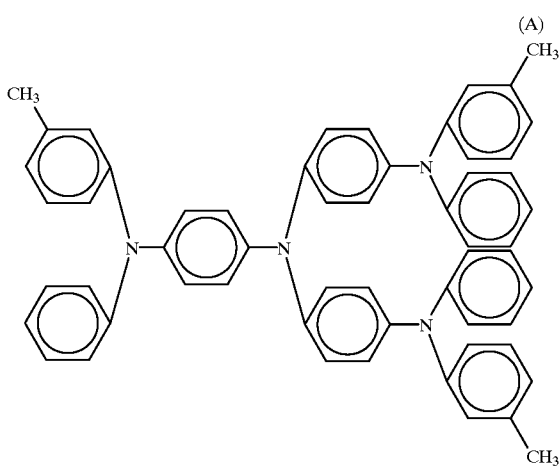

(A)

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

EXAMPLE 2

The ITO layer of a commercial glass substrate with adhered ITO layer (GEOMATEC CO. Ltd.) was subjected to ultrasonic washing in distilled water and acetone for 20 min each.

The cleaned ITO substrate was placed in chamber 101, and the pressure within chamber 101 was reduced to a vacuum of less than $1.0 \times 10^{-5}$ Torr via a vacuum pump P. Thereafter, pure air gas, i.e., gas consisting of 25% of oxygen gas and 75% of nitrogen gas with both gases having 99.99% purity, was introduced to attain a pressure of 0.2 Torr within the chamber 101. Whereupon, the substrate 103 was irradiated for 3 min by excimer light of 172 nm wavelength using the same manufacturing method as in example 1 and the device shown in FIG. 5.

The processed ITO substrate was moved to a holder in the layer-forming device without breaking the vacuum. Subsequently, a triphenyl amine conductive layer having the structural formula (A) was formed on the substrate at a vacuum deposition rate of 5 Å/sec and a thickness of 65 nm as a hole injection/transporting layer under a vacuum of $1.0 \times 10^{-5}$ Torr.

Then tris(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

EXAMPLE 3

The ITO layer of a commercial glass substrate with adhered ITO layer (GEOMATEC CO. Ltd.) was subjected to ultrasonic washing in distilled water and acetone for 20 min each.

A UV/ozone cleaning device (JAPAN LASER ELECTRON CORPORATION) washed the cleaned ITO substrate in a purified air atmosphere for 10 minutes. Thereafter, the substrate was placed in chamber 101, and the pressure within chamber 101 was reduced to a vacuum of less than $1.0 \times 10^{-5}$ Torr via a vacuum pump P. Thereafter, pure air was introduced to attain a pressure of 0.2 Torr within the chamber 101, whereupon the substrate 103 was irradiated for 3 min by excimer light of 172 nm wavelength using the same manufacturing method as in example 1 and the device shown in FIG. 5. The pure air and dilute gas used were common to example 1.

The processed ITO substrate was moved to a holder in a separate layer-forming device without breaking the vacuum. Subsequently, a triphenyl amine conductive layer having the structural formula (A) was formed on the substrate at a vacuum deposition rate of 5 Å/sec and a thickness of 65 nm as a hole injection/transporting layer in a vacuum of $1.0 \times 10^{-5}$ Torr.

Then tris(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

EXAMPLE 4

A commercial glass substrate with adhered ITO layer (GEOMATEC CO. Ltd.) was washed by a UV/ozone cleaning device (JAPAN LASER ELECTRON CORPORATION) in a purified air atmosphere for 10 min, then subjected to ultrasonic washing in distilled water and acetone for 20 min each.

The cleaned ITO substrate was placed in chamber 101, and the pressure within chamber 101 was reduced to a vacuum of less than $1.0 \times 10^{-5}$ Torr via a vacuum pump P. Thereafter, pure air was introduced to attain a pressure of 0.2 Torr within the chamber 101, whereupon the substrate 103 was irradiated for 3 min by excimer light of 172 nm wavelength using the same manufacturing method as in example 1 and the device shown in FIG. 5. The pure air and dilute gas used were common to example 1.

The processed ITO substrate was moved to a holder in a separate layer-forming device without breaking the vacuum. Subsequently, a triphenyl amine conductive layer having the structural formula (A) was formed on the substrate at a vacuum deposition rate of 5 Å/sec and a thickness of 65 nm as a hole injection/transporting layer in a vacuum of $1.0 \times 10^{-5}$ Torr.

Then tris(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

EXAMPLE 5

The ITO layer of a commercial glass substrate with adhered ITO layer (GEOMATEC CO. Ltd.) was subjected to ultrasonic washing in dilute hydrochloric acid, distilled water and acetone for 20 min each.

The cleaned ITO substrate was placed in chamber 101, and the pressure within chamber 101 was reduced to a vacuum of less than $1.0 \times 10^{-5}$ Torr via a vacuum pump P. Thereafter, pure air was introduced to attain a pressure of 0.5 Torr within the chamber 101, whereupon the substrate 103 was irradiated for 5 min by excimer light of 172 nm wavelength using the same manufacturing method as in example 1 and the device shown in FIG. 5. The pure air and dilute gas used were common to example 1.

The processed ITO substrate was moved to a holder in a separate layer-forming device without breaking the vacuum. Subsequently, a triphenyl amine conductive layer having the structural formula (A) was formed on the substrate at a vacuum deposition rate of 5 Å/sec and a thickness of 65 nm as a hole injection/transporting layer in a vacuum of $1.0 \times 10^{-5}$ Torr.

Then tris(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

Finally, a sealing layer 300 nm in thickness was formed on the substrate by vacuum deposition via a resistance heating method using silicone oxide as a vacuum deposition source.

The aforesaid process produced an organic electroluminescent element.

EXAMPLE 6

A commercial glass substrate with adhered ITO layer (GEOMATEC Co.Ltd.) was washed by a UV/ozone cleaning device (JAPAN LASER ELECTRON CORPORATION) in a purified air atmosphere for 10 min, then subjected to ultrasonic washing in distilled water and acetone for 20 min each.

The cleaned ITO substrate was placed in chamber 101, and the pressure within chamber 101 was reduced to a vacuum of less than $1.0 \times 10^{-5}$ Torr via a vacuum pump P. Thereafter, pure air was introduced to attain a pressure of 0.5 Torr within the chamber 101, whereupon the substrate 103 was irradiated for 5 min by excimer light of 172 nm wavelength using the same manufacturing method as in example 1 and the device shown in FIG. 5. The pure air and dilute gas used were common to example 1.

The processed ITO substrate was moved to a holder in a separate layer-forming device without breaking the vacuum, and a layer of N,N'-diphenyl-N,N'-bis(1-naphthyl)-1,1'-diphenyl-4,4'-diamine was formed on the substrate at a vacuum deposition rate of 5 Å/sec and a thickness of 65 nm as a hole injection/transporting layer in a vacuum of $1.0 \times 10^{-5}$ Torr.

Then a layer comprising tris(8-hydroxyquinoline) aluminum complex doped with 5 percent-by-weight rubrene was deposited on the surface of the substrate at a vacuum deposition rate of 6 Å/sec and thickness of 20 nm as a luminescent layer.

Next, tris(8-hydroxyquinoline) aluminum complex was deposited at a vacuum deposition rate of 6 Å/sec and thickness of 45 nm as an electron injection/transporting layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

Finally, a sealing layer 300 nm in thickness was formed on the substrate by vacuum deposition via a resistance heating method using silicone oxide as a vacuum deposition source.

The aforesaid process produced an organic electroluminescent element.

Comparative Example 1

The ITO layer of a commercial glass substrate with the adhered ITO layer (GEOMATEC Co.Ltd.) was subjected to ultrasonic washing in distilled water and acetone for 20 min each.

The cleaned ITO substrate was removed and placed in a holder in a separate layer-forming device. The pressure within the chamber was reduced to a vacuum of less than $1.0 \times 10^{-5}$ Torr. Subsequently, a triphenyl amine conductive layer having the structural formula (A) was formed on the substrate at a vacuum deposition rate of 5 Å/sec and a thickness of 65 nm as a hole injection/transporting layer in a vacuum of $1.0 \times 10^{-5}$ Torr.

Then trls(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

Comparative Example 2

The ITO layer of a commercial glass substrate with the adhered ITO layer (GEOMATEC Co.Ltd.) was subjected to ultrasonic washing in distilled water and acetone for 20 min each.

The cleaned ITO substrate was removed and placed in a plasma device. After pressure in the chamber was reduced to a vacuum of less than $1.0 \times 10^{-5}$ Torr. Subsequently, Argon gas was introduced to attain a pressure of $3 \times 10^{-2}$ Torr within the chamber, and a high frequency voltage of 0.2 W/cm$^2$ was applied for 30 min to clean the ITO substrate in a plasma wash.

Then tris(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

Comparative Example 3

The ITO layer of a commercial glass substrate with the adhered ITO layer (GEOMATEC Co.Ltd.) was placed in a purified atmosphere and cleaned using a UV/ozone cleaning device (JAPAN LASER ELECTRON CORPORATION) for 10 min, then subjected to ultrasonic washing in distilled water and acetone for 20 min each.

The cleaned ITO substrate was placed in a holder in a separate layer-forming device. The pressure within the chamber was reduced to a vacuum of less than $1.0 \times 10^{-5}$ Torr. Subsequently, a triphenyl amine conductive layer having the structural formula (A) was formed on the substrate at a vacuum deposition rate of 5 Å/sec and a thickness of 65 nm as a hole injection/transporting layer.

Then tris(8-hydroxyquinoline)aluminum complex was deposited on the surface of the substrate at a vacuum deposition rate of 6 Å/sec and thickness of 65 nm as a luminescent layer.

A vacuum deposition layer about 200 nm in thickness was formed on the luminescent layer as a negative electrode. The vacuum deposition was done by a resistance heating method using Mg and Ag as the vacuum deposition source at a vacuum deposition speed ratio of Mg:Ag=10:1.

The aforesaid process produced an organic electroluminescent element.

Evaluations

The glass electrode of the organic electroluminescent elements produced in examples 1~6 and comparative examples 1~3 were used as positive electrodes. The luminescence starting potential V was measured when a direct current was continuously applied, the luminescence brightness (cd/m2) was measured when a 10 V direct current was applied, and the condition of luminescence (e.g., irregular luminescence, dark spots) was evaluated. Reproducibility of element functionality was measured using four samples from each manufacturing method.

The aforesaid elements were continuously luminesced at a starting luminescence brightness of 100 cd/m2 at room temperature and in an inactive atmosphere of nitrogen gas, and the half-life period (i.e., the time required for the brightness to decay to 50 cd/m2) of said luminescence brightness was measured.

Measurement results are shown in Table 1 below.

TABLE 1

|       | Uneven luminescence | Dark spots | Element function reproducibility | Luminescence starting voltage (V) | Brightness (cd/m2) | Brightness half-life (time) |
|-------|---|---|---|---|---|---|
| Ex. 1 | B | A | B | 5.0 | 7800 | 347 hr |
| Ex. 2 | B | A | B | 5.0 | 8500 | 382 hr |
| Ex. 3 | A | A | A | 4.5 | 10100 | 451 hr |
| Ex. 4 | A | A | A | 4.5 | 10600 | 486 hr |
| Ex. 5 | B | A | B | 4.5 | 9300 | 409 hr |
| Ex. 6 | A | A | A | 4.5 | 12000 | 537 hr |
| CE. 1 | C | D | D | 6.0 | 1400 | 184 hr |
| CE. 2 | B | B | C | 5.5 | 4500 | 276 hr |
| CE. 3 | B | B | D | 5.5 | 3100 | 231 hr |

Reference symbols in the drawing are defined below.
A: Excellent
B: Good
C: Fair
D: Poor As can be understood from Table 1, the organic electroluminescent element of the present invention has a low luminescence starting potential with a uniform luminescence, and excellent luminescence brightness even at low potential.

The organic electroluminescent element of the present invention provides improved luminescence efficiency and luminescence brightness as well as prolonged the service life. The luminescence enhancing materials, charge transporting materials, sensitizers, resins electrode materials and the like used together as well as the element manufacturing method are not limited to those cited in the examples.

The present invention provides for the manufacture of an organic electroluminescent element having excellent durability, excellent luminescence brightness, uniform luminescence without non-luminescent areas, and low luminescence starting voltage by forming an organic layer on a positive electrode which has been previously irradiated by excimer light.

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. An organic electroluminescent element, comprising:
    a positive electrode irradiated by excimer light to remove organic material adhering to a surface of said positive electrode and to oxidize said surface;
    an organic luminescent layer formed on said irradiated surface of said positive electrode; and
    a negative electrode formed on said organic luminescent layer.

2. The organic electroluminescent element claimed in claim 1, wherein said positive electrode substrate is irradiated by excimer light in an atmosphere containing oxygen.

3. The organic electroluminescent element claimed in claim 1, wherein said positive electrode is irradiated by excimer light after said positive electrode is subjected to a washing process.

4. The organic electroluminescent element claimed in claim 1, wherein said positive electrode is irradiated by excimer light after said positive electrode is subjected to a washing process, and an organic luminescent layer is formed on said irradiated positive electrode without said irradiated positive electrode being exposed to air.

5. The organic electroluminescent element claimed in claim 3, wherein an organic luminescent layer is formed on said irradiated positive electrode without said irradiated positive electrode being exposed to air.

6. A method of manufacturing an organic electroluminescent element, comprising:
    irradiating a positive electrode by excimer light external to a plasma to remove organic material adhering to a surface of said positive electrode and to oxidize said surface;
    forming an organic luminescent layer on said irradiated surface of said positive electrode; and
    forming a negative electrode on said organic luminescent layer.

7. The method of manufacturing an organic electroluminescent element claimed in claim 6, wherein said positive electrode is washed, and subsequently irradiated by excimer light.

8. A method of manufacturing an organic electroluminescent element claimed in claim 6, further comprising:

forming an organic layer including an organic luminescent layer on said positive electrode without exposing said positive electrode to air.

9. A device having an organic electroluminescent element, comprising:

a positive electrode irradiated by excimer light external to a plasma to remove organic material adhering to a surface of said positive electrode and to oxidize said surface;

an organic layer including an organic luminescent layer formed on said irradiated surface of said positive electrode; and a negative electrode formed on said organic layer.

10. A method of operating an organic electroluminescent element, comprising:

forming said organic electroluminescent element, and applying a 10 V direct current to produce uniform luminescence substantially free of dark spots on said organic electroluminescent element, wherein said organic electroluminescent element comprises:

a positive electrode irradiated by excimer light to remove organic material adhering to a surface of said positive electrode and to oxidize said surface;

an organic luminescent layer formed on said irradiated surface of said positive electrode; and a negative electrode formed on said organic luminescent layer.

11. An organic electroluminescent element, comprising:

a positive electrode irradiated by excimer light to clean a surface of said positive electrode and to increase an ionization potential of said surface;

an organic luminescent layer formed on said irradiated surface of said positive electrode; and a negative electrode formed on said organic luminescent layer.

12. An organic electroluminescent element, comprising:

a positive electrode irradiated by excimer light after said positive electrode has been subjected to a UV/ozone washing and wet-type washing;

an organic luminescent layer formed on said irradiated surface of said positive electrode; and a negative electrode formed on said organic luminescent layer.

* * * * *